United States Patent
Lee et al.

(10) Patent No.: US 12,503,622 B2
(45) Date of Patent: Dec. 23, 2025

(54) CERIUM-BASED PARTICLE AND POLISHING SLURRY COMPOSITION INCLUDING THE SAME

(71) Applicant: KCTECH CO., LTD., Gyeonggi-do (KR)

(72) Inventors: Jeong Gyu Lee, Gyeonggi-do (KR); Hyo Jun Jang, Gyeonggi-do (KR); Jun Ha Hwang, Gyeonggi-do (KR)

(73) Assignee: KCTECH CO., LTD., Gyeonggi-do (KR)

( * ) Notice: Subject to any disclaimer, the term of this patent is extended or adjusted under 35 U.S.C. 154(b) by 742 days.

(21) Appl. No.: 17/863,489

(22) Filed: Jul. 13, 2022

(65) Prior Publication Data

US 2023/0025469 A1 Jan. 26, 2023

(30) Foreign Application Priority Data

Jul. 13, 2021 (KR) .................. 10-2021-0091762

(51) Int. Cl.
| | | |
|---|---|---|
| *H01L 21/321* | (2006.01) | |
| *C01F 17/235* | (2020.01) | |
| *C09G 1/02* | (2006.01) | |
| *C09K 3/14* | (2006.01) | |
| *H01L 21/3105* | (2006.01) | |

(52) U.S. Cl.
CPC .............. *C09G 1/02* (2013.01); *C01F 17/235* (2020.01); *H01L 21/3212* (2013.01); *C01P 2004/03* (2013.01); *C01P 2004/04* (2013.01); *C01P 2004/32* (2013.01); *C01P 2004/50* (2013.01); *C01P 2004/64* (2013.01); *C01P 2006/10* (2013.01); *C01P 2006/11* (2013.01); *C01P 2006/12* (2013.01); *C01P 2006/80* (2013.01); *C09K 3/1409* (2013.01); *C09K 3/1463* (2013.01); *H01L 21/31053* (2013.01)

(58) Field of Classification Search
CPC ...................................................... C09G 1/02
See application file for complete search history.

(56) References Cited

U.S. PATENT DOCUMENTS

| 2004/0152309 A1* | 8/2004 | Carter ............... C03C 19/00 |
| | | 438/689 |
| 2006/0060568 A1* | 3/2006 | So ............... H01L 21/7684 |
| | | 438/692 |
| 2010/0015188 A1* | 1/2010 | Izu ............... A61K 8/0275 |
| | | 428/407 |

FOREIGN PATENT DOCUMENTS

| CN | 101039876 A | 9/2007 |
| CN | 109689828 A | 4/2019 |
| CN | 110903766 A | 3/2020 |
| CN | 113004803 A | 6/2021 |
| KR | 20170004462 A | 1/2017 |
| KR | 1020210078956 A | 6/2021 |

OTHER PUBLICATIONS

Horiuchi et al Electron microscopy investigations of the organization of cerium oxide nanocrystallites and polymers developed in polyvinylpyrrolidone-assisted polyol synthesis process. J Nanopart Res (2012) 14:734 (Year: 2012).*

Baqer Anwar et al., "Effect of polyvinylpyrrolidone on cerium oxide nanoparticle characteristics prepared by a facile heat treatment technique,"Results in Physics, Jan. 18, 2017, 9 pgs.

Wu, Lijun et al., "Oxidation state and lattice expansion of CeO2-x nanoparticles as a function of particle size," Physical Review, vol. 69, 2004.

Renuka, Neeroli, "Structural characteristics of quantum-size ceria nano particles synthesized via simple ammonia precipitation," Journal of Alloys and Compounds, vol. 512, 2012, pp. 230-235.

Netzband, C. M. et al., "Investigation into the Effect of CMP Slurry Chemicals on Ceria Abrasive Oxidation State using XPS," ECS Journal of Solid State Science and Technology, 2019.

* cited by examiner

*Primary Examiner* — Alexandra M Moore
(74) *Attorney, Agent, or Firm* — DICKINSON WRIGHT PLLC

(57) ABSTRACT

Provided is a cerium-based particle and a polishing slurry composition including the same. The cerium-based particle may include a self-assembly of fine particles and an organic material. The cerium-based particle is a spherical ceria powder connected by a crystalline network formed by a self-assembly of a fine particle. The cerium-based particle is a heat-treated self-assembly of fine particles. The moisture content of the self-assembly of the fine particles is 2% or less, and the temperature of the heat treating is in the range of 500° C. to 600° C.

12 Claims, 1 Drawing Sheet

CERIUM-BASED PARTICLE AND POLISHING SLURRY COMPOSITION INCLUDING THE SAME

CROSS-REFERENCE TO RELATED APPLICATION

This application claims the benefit of Korean Patent Application No. 10-2021-00091762, filed on Jul. 13, 2021, in the Korean Intellectual Property Office, the entire disclosure of which is incorporated herein by reference for all purposes.

BACKGROUND

1. Field of the Invention

One or more example embodiments relate to a new cerium-based particle and polishing slurry composition comprising the same.

2. Description of the Related Art

A chemical mechanical polishing (CMP) process is performed by putting a slurry containing an abrasive particle on a substrate and using a polishing pad mounted on a polishing apparatus. Here, the abrasive particle is subjected to pressure from the polishing apparatus to mechanically polish a surface, and a chemical component included in the polishing slurry composition chemically reacts to the surface of the substrate to chemically remove the surface portion of the substrate.

In general, there are various types of polishing slurry compositions depending on the type and characteristics of an object to be removed. With a conventional slurry composition, there are problems in that a silicon oxide film, silicon nitride film, and polysilicon film cannot be selectively polished, a desired level of polishing speed cannot be obtained, or defects and scratches occur, and aggregation occurs due to low dispersion stability.

Because a dry ceria particle has an angular grain shape and wide particle size distribution due to limitations in the manufacturing method, micro-scratches are inevitable due to polishing process. Compared to the dry ceria particle, a wet ceria particle has a better particle distribution, less formation of large particles, and a polyhedral structure, so micro-scratches are largely overcome compared to the conventional dry ceria particle.

To reduce defects and scratches of the polishing film, and to improve dishing and erosion values in a pattern, the necessity of applying small-sized particles is increasing. Also, the demand for securing a stable and high polishing rate for oxide layer and poly layer is increasing, and it is necessary to develop abrasive particles that may easily secure polishing performances suitable for each semiconductor process and control dispersion stability.

SUMMARY

Example embodiments provide, in order to resolve the above-mentioned problems, a new cerium-based particle, which is a crystal particle made of an aggregate of self-assembled fine particles and is advantageous in providing a polishing performance suitable for each semiconductor process.

Example embodiments provide a polishing slurry composition including the cerium-based particle according to example embodiments of the present disclosure.

However, aspects to be achieved in the present disclosure are not limited to the above-described aspects, and other aspects not mentioned herein may be clearly understood by a person having ordinary skill in the art to which the present disclosure pertains from the following description.

According to an aspect, there is provided a cerium-based particle including a self-assembly of a fine particle and an organic material.

According to an aspect, the organic material may be included in an amount of 0.05 wt % to 0.4 wt % in the cerium-based particle.

According to an aspect, the cerium-based particle may be a spherical ceria powder connected by a crystalline network formed by self-assembly of a fine particle, and the organic material may be included in a surface of the cerium-based particle, inside of the cerium-based particle, or both in a surface and inside of the particle.

According to an aspect, the cerium-based particle may be porous, and the cerium-based particle may have a BET specific surface area (BET) of 120 $m^2/g$ to 180 $m^2/g$.

According to an aspect, the cerium-based particle may have a density of 5 $g/cm^3$ to 7.2 $g/cm^3$.

According to an aspect, $Ce3+$ may be included in the cerium-based particle in an amount of 20 mol % to 25 mol %.

According to an aspect, the particle size of the fine particle of the cerium-based particles may be in the range of 8 nm to 15 nm calculated by XRD, and in the range of 5 nm to 7 nm calculated from a BET specific surface area.

According to an aspect, the cerium-based particle powder may be a heat-treated self-assembly of primary particles, and the moisture content of the self-assembly of the primary particles may be 0.2% or less, wherein the temperature of the heat treating may be in the range of 400° C. to 600° C.

Example embodiments provide a polishing slurry composition including an abrasive particle including a cerium-based particle, wherein the cerium-based particle includes a self-assembly of a fine particle, and an organic material.

According to an aspect, the abrasive particle may be included in an amount of 0.1 wt % to 10 wt % in the polishing slurry composition.

According to an aspect, the pH of the polishing slurry composition may be in the range of 2 to 11.

According to an aspect, the polishing slurry composition further includes a pH adjuster, wherein the pH adjuster may include at least one selected from the group consisting of:
at least one acidic material selected from a group consisting of hydrochloric acid, phosphoric acid, nitric acid, sulfuric acid, hydrofluoric acid, bromic acid, iodic acid, formic acid, malonic acid, maleic acid, oxalic acid, acetic acid, adipic acid, citric acid, propionic acid, fumaric acid, lactic acid, salicylic acid, pimelic acid, benzoic acid, succinic acid, phthalic acid, butyric acid, glutaric acid, glutamic acid, glycolic acid, aspartic acid, tartaric acid and a salt thereof, and at least one basic material selected from a group consisting of ammonia, ammonium methyl propanol (AMP), tetra methyl ammonium hydroxide (TMAH), ammonium hydroxide, potassium hydroxide, sodium hydroxide, magnesium hydroxide, rubidium hydroxide, cesium hydroxide, sodium bicarbonate, sodium carbonate, and imidazole.

According to an aspect, a target polishing layer of the polishing slurry composition may be an oxide film, an insulating film, or both the oxide film and insulating film.

According to an aspect, a polishing stop layer of the polishing slurry composition may be a nitride film, a polysilicon film, or both the nitride film and polysilicon film.

According to example embodiments, the present disclosure may provide a new cerium-based particle powder capable of controlling a physical property for improving the particle dispersibility and the polishing performance according to the content of an organic material.

According to example embodiments, the present disclosure may provide a polishing slurry composition capable of improving a polishing property of an oxide layer, a nitride layer, and a poly layer and suppressing the occurrence of scratches and dishing using the cerium-based particle powder.

Also, the present disclosure may provide a CMP slurry composition for an STI process and an ILD process in a semiconductor manufacturing process, as well as a CMP slurry composition capable of automatically stopping a polishing of a nitride layer.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects, features, and advantages of the invention will become apparent and more readily appreciated from the following description of example embodiments, taken in conjunction with the accompanying drawing of which:

FIG. 1A corresponds to ceria particles of Example 1, FIG. 1B corresponds to solid ceria particles of Comparative Example 1 and FIG. 1C corresponds to wet ceria particles of Comparative Example 2, according to an example embodiment.

DETAILED DESCRIPTION

Figure 1A:
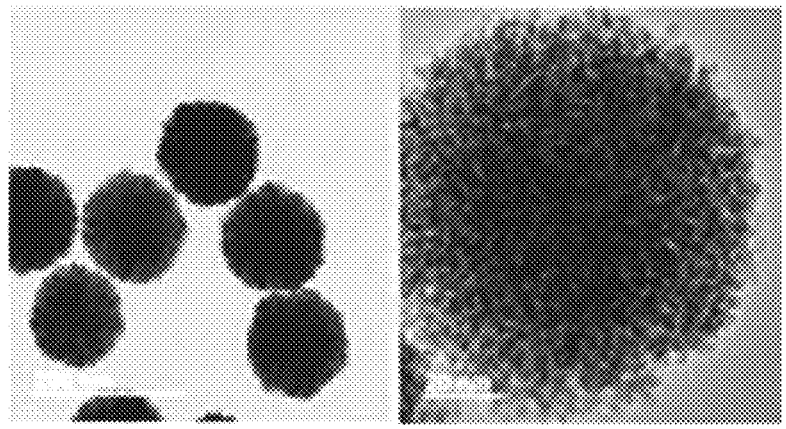
FIGS. 1A to 1C illustrate scanning electron microscope (SEM) images of ceria particles presented in examples and comparative examples.

Example embodiments of the present disclosure will be described in detail with reference to the accompanying drawings attached in the following. When it is determined that the detailed description related to a related known function or configuration may make the purpose of the present disclosure unnecessarily ambiguous in describing the present disclosure, the detailed description is omitted. In addition, terminologies used herein are defined to appropriately describe the example embodiments and thus may be changed depending on a user, the intent of an operator, or a custom of a field to which the present disclosure pertains. Accordingly, the terminologies must be defined based on the following overall description of the present specification. In the drawings, like reference numerals are used for like elements.

It will be understood that when a certain part "includes" a certain component, the part does not exclude another component but may further include another component, unless the context clearly dictates otherwise.

Hereinafter, a new cerium-based particle and a polishing slurry composition including the same will be described in detail with reference to example embodiments. However, the present disclosure is not limited to such example embodiments.

The present disclosure relates to a new cerium-based particle, and according to an example embodiment of the present disclosure, the cerium-based particle is a self-assembly of fine particles, is a crystalline particle in which the fine particles are connected by physical and/or chemical treatment, has abrasive properties for a CMP process by modification of the surface, pore characteristics, particle size, constituents and others of the cerium-based particle, and may provide polishing properties suitable for a polishing object and purpose.

According to an example embodiment of the present disclosure, the cerium-based particle may include a self-assembly of fine particles and an organic material.

As an example of the present disclosure, the organic material may be included in the surface, inside the cerium-based particle, or both in the surface and inside the cerium-based particle; for example, a self-assembly. The organic material is carbon and may be included in the cerium-based particle by 0.05 wt % to 0.4 wt %. When included in the content range, the organic material may be advantageous in providing excellent polishing properties in a CMP process and a desired polishing performance depending on a target CMP object.

As an example of the present disclosure, the cerium-based particle may be a spherical ceria powder connected by a crystalline network by self-assembled fine particles, and the sphericity of the cerium-based particle may be 0.4 or higher; 0.6 or higher; or 0.7 or higher, to achieve a high polishing speed in the CMP process and reduce defects and scratches in the target polishing layer.

As an example of the present disclosure, the cerium-based particle is porous and has a BET specific surface area of 120 $m^2/g$ to 180 $m^2/g$, or 130 $m^2/g$ to 160 $m^2/g$, and may have a density of 5 $g/cm^3$ to 7.2 $g/cm^3$, or 5 $g/cm^3$ to 6 $g/cm^3$. When included in the specific surface area and density range, the cerium-based particle may be advantageous in providing a high polishing speed by sufficiently securing the area of a portion which contacts the target polishing layer.

As an example of the present disclosure, the cerium-based particle may have a size of 8 nm to 15 nm as a grain size of a fine particle calculated by XRD, and a fine particle size of 5 nm to 7 nm as calculated by a BET analysis. The cerium-based particle may be advantageous in providing a high polishing speed by sufficiently securing the area of a portion which contacts the target polishing layer within the particle size range.

As an example of the present disclosure, Ce3+ ions in the cerium-based particle may be 20% to 25% (mol %). When included within the above content range, it is advantageous to achieve a high polishing rate.

According to an example embodiment of the present disclosure, the cerium-based particle may be a crystalline particle formed by heat-treating a self-assembly of fine particles, and the self-assembly may be capable of controlling the ensemble structure, properties, shape and size of the cerium-based particle. In other words, before the heat treatment, the fine particles are non-agglomerated particles formed by the initial reaction and are self-assembled by physical and chemical properties. The cerium-based particle may provide a desired polishing performance depending on the target polishing layer in a CMP process, by controlling a residual amount of an organic material, such as, carbon, used during a synthesis process due to the heat treatment process. Also, the self-assembly of fine particles before heat treatment may have a moisture content of 0.2% or less. The heat treatment temperature is 400° C. to 600° C. and the heat treatment may be performed for 1 to 5 hours. The heat treatment may be repeated 1 or more times, 2 or more times, or 3 or more times by setting the same or different temperature and time in the heat treatment process.

The present disclosure relates to the polishing slurry composition including the cerium-based particle according to the present disclosure, and according to an example embodiment of the present disclosure, the cerium-based particle is a crystal particle agglomerated by a self-assembly of fine particles, capable of improving polishing properties and suppressing the occurrence of scratches and dishing by controlling the surface, pore properties and/or the content of organic materials such as residual carbon. Also, the cerium-based particle may have long-term dispersion stability and provide a high polishing speed of a target polishing layer.

As an example of the present disclosure, the cerium-based particle may be included in the polishing slurry composition by 0.1 wt % to 10 wt %. If the content of the abrasive particles is included within the above range, it is advantageous in securing a high polishing speed of the target polishing layer, and may prevent a decrease in stability due to an increase in abrasive particle content, and reduce the occurrence of dishing, scratches, and the like.

According to an example embodiment of the present disclosure, the slurry may further include a pH adjusting agent, which may include an acidic material, a basic material, or both acidic and basic materials.

For example, the acidic material may include one or more from the group of hydrochloric acid, phosphoric acid, nitric acid, sulfuric acid, hydrofluoric acid, bromic acid, iodic acid, formic acid, malonic acid, maleic acid, oxalic acid, acetic acid, adipic acid, citric acid, propionic acid, fumaric acid, lactic acid, salicylic acid, pimelic acid, benzoic acid, succinic acid, phthalic acid, butyric acid, glutaric acid, glutamic acid, glycolic acid, aspartic acid, tartaric acid and a salt of the same.

For example, the basic material may include one or more from the group of ammonia, Ammonium Methyl Propanol (AMP), Tetra Methyl Ammonium Hydroxide (TMAH), ammonium hydroxide, potassium hydroxide, sodium hydroxide, magnesium hydroxide, rubidium hydroxide, cesium hydroxide, sodium bicarbonate, sodium carbonate, and imidazole.

According to an example embodiment of the present disclosure, the pH of the polishing slurry composition is in the range of 2 to 11, 3 to 10, 3 to 6, or 3 to 5. The pH may be adjusted by the addition of a pH adjusting agent, and the polishing slurry composition may adjust the pH range according to the target polishing layer and thus procure a sufficient polishing speed, and prevent defects such as damage of a substrate, inconsistent roughness of a surface, dishing, erosion, corrosion, and surface imbalance.

According to an example embodiment of the present disclosure, the polishing slurry composition may control the polishing speed in the CMP process based on the physical properties of the cerium-based particle according to an example embodiment of the present disclosure, such as, the content of residual carbon. For example, the polishing slurry composition may increase the polishing speed of a target polishing layer, for example, an oxide film, an insulating film, or both the oxide film and the insulating film, or may refer to an automatic polishing stop function for a nitride film or a polysilicon film.

As an example of the present disclosure, the polishing slurry composition may polish a substrate including an oxide layer, a nitride layer and/or a poly layer in a CMP process, and the polishing speed for the oxide layer may be 2,500 Å/min or more, and the polishing speed for the nitride layer may be 100 Å/min or less, and the polishing speed for the poly layer may be 100 Å/min or less.

Hereinafter, the present disclosure will be described in more detail through example embodiments, but the following examples are for illustrative purposes only and are not intended to limit the scope of the present disclosure.

(1) Synthesis of Self-Assembly Ceria Powder (SAC)

Example 1

A mixed solution of cerium nitrate, a solvent (EG, ethylene glycol) and an additive (PVP, polyvinylpyrrolidone) was prepared and then maintained by shaking for 8 to 12 hours at 100° C. to 150° C. After the reaction was completed, the mixed solution was rinsed with deionized water (DIW) and dried to obtain a powder (moisture content of the powder was within 2%).

The dried powder was heat-treated at 500° C. (air atmosphere) for 1 to 4 hours using a batch kiln.

Example 2

A dried powder dried in the same manner as in example embodiment 1 was obtained, which was then heat-treated at 500° C. (air atmosphere) for 1 to 4 hours using a continuous kiln.

Example 3

The same preparation was done as in example embodiment 2 except for changing the heat treatment temperature to 600° C.

Comparative Example 1

A solid ceria powder was obtained by calcining at 800° C. according to a conventional solid ceria manufacturing method.

Comparative Example 2

Colloidal ceria (HC60) was used.

Figure 1B:
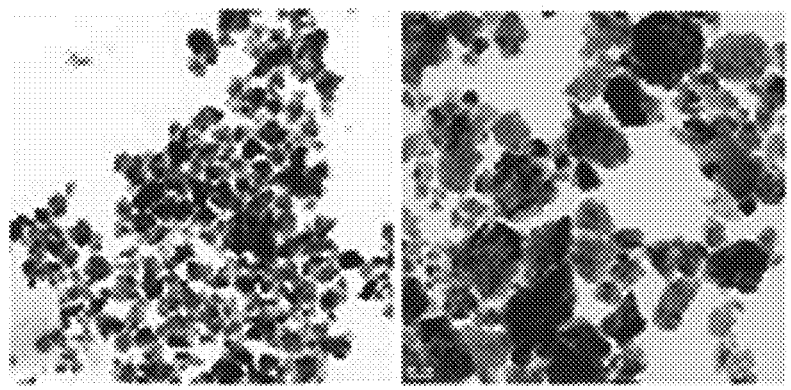
Figure 1C:
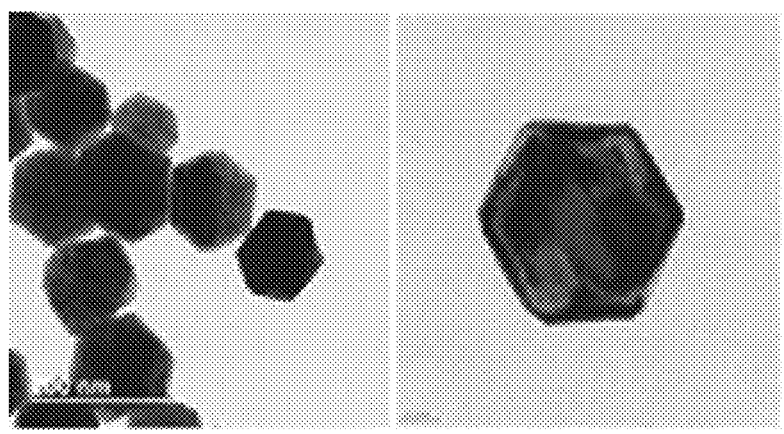

TEM images of the ceria particle powders of example embodiment 1, comparative example 1, and comparative example 2 are shown in FIG. 1. It can be confirmed from FIG. 1 that example embodiment 1 is a porous crystal particle having a size of 120 nm to 130 nm, which is a self-assembly of fine particles. Also, it can be confirmed that the pore and surface properties of example embodiment 1 are different from the ceria particles of comparative examples 1 and 2.

Evaluation of Particle Properties

The physical properties of the ceria particle powder obtained in the example embodiments and comparative examples were measured and are shown in Table 1.

(1) Density Measurement

The volume of the sample was calculated by filling in a gas and then calculating the difference in volume before and after filling in the gas. (Measuring equipment: Gas pycnometer (Quantachrome Inst. (UltraPycnometer 1200e))

(2) Average Particle Size

Grain size was measured by calculating a half width using the Scherrer formula (Debey-Scherrer formula) in a XRD pattern (Measuring equipment: Model: Rigaku ultima iv).

BET specific surface area was measured and particle size was calculated. (Measuring equipment: Model: Micromeritics_ASAP2400)

(3) Specific Surface Area

BET specific surface area was measured. (Measuring equipment: Model: Micromeritics_ASAP2400)

TABLE 1

| Category | | Example 1 | Example 2 | Example 3 | Comparative Example 1 | Comparative Example 2 |
|---|---|---|---|---|---|---|
| Average Particle Size (nm) | XRD | 9.3 | 9.9 | 12.5 | 46 | 33 |
| | BET | 5.5 | 5.2 | 11.2 | 25 | 80 |
| Specific Surface Area (m²/g) | | 148 | 158 | 73 | 78 | 11 |
| Density (g/cm³) | | 5.53 | 5.52 | 5.58 | 6 | 6.81 |
| Residual Carbon (wt %) | | 0.14 | 0.16 | 0.06 | 0.5 | Lower Limit of Detection |
| $Ce^{3+}$ (mol %) | | 21.2 | 22.8 | 22.5 | 19 | 17 |

*Average particle size refers to the size of fine particles in example embodiments 1 to 3, and the size of primary particles in comparative examples 1 to 2.

It can be confirmed that example embodiments 1 to 3 correspond to self-assembled particles of fine particles containing residual carbon, and are materials different from comparative examples 1 and 2 in terms of average particle size, carbon content, surface properties and Ce3+ ions.

A number of example embodiments have been described above but are not intended to limit the scope of the present disclosure. It should be understood that various modifications may be made to these example embodiments. Therefore, the scope of the disclosure is defined not by the detailed description, but by the claims and their equivalents, and all variations within the scope of the claims and their equivalents are to be construed as being included in the disclosure.

What is claimed is:

1. A cerium-based particle comprising:
   a self-assembly of fine particles; and
   an organic material,
   wherein the fine particle size of the cerium-based particle is in the range of 8 nm to 15 nm as calculated by XRD, and is in the range of 5 nm to 7 nm as calculated from a BET-specific surface area,
   wherein the organic material is residual carbon,
   wherein the cerium-based particle is a spherical ceria powder connected by a crystalline network formed by a self-assembly of a fine particle,
   wherein the cerium-based particle is a heat-treated self-assembly of fine particles,
   the moisture content of the self-assembly of the fine particles is 2% or less, and
   the temperature of the heat treating is in the range of 500° C. to 600° C.

2. The cerium-based particle of claim 1, wherein the organic material is included in an amount of 0.05 wt % to 0.4 wt % in the cerium-based particle.

3. The cerium-based particle of claim 1, wherein the organic material is included in a surface of the cerium-based particle, inside of the cerium-based particle, or both in a surface and inside of the particle.

4. The cerium-based particle of claim 1, wherein the cerium-based particle is configured to be porous, and the cerium-based particle has a BET-specific surface area of 120 m²/g to 180 m²/g.

5. The cerium-based particle of claim 1, wherein the cerium-based particle has a density in the range of 5 g/cm³ to 7.2 g/cm³.

6. The cerium-based particle of claim 1, wherein Ce3+ is included in an amount of 20 mol % to 25 mol % in the cerium-based particle.

7. A polishing slurry composition comprising:
   abrasive particles comprising a cerium-based particle,
   wherein the cerium-based particle comprises:
   a self-assembly of a fine particle; and
   an organic material,
   wherein the fine particle size of the cerium-based particle is in the range of 8 nm to 15 nm as calculated by XRD, and is in the range of 5 nm to 7 nm as calculated from a BET-specific surface area,
   wherein the organic material is residual carbon,
   wherein the cerium-based particle is a spherical ceria powder connected by a crystalline network formed by a self-assembly of a fine particle,
   wherein the cerium-based particle is a heat-treated self-assembly of fine particles,
   the moisture content of the self-assembly of the fine particles is 2% or less, and
   the temperature of the heat treating is in the range of 500° C. to 600° C.

8. The polishing slurry composition of claim 7, wherein the abrasive particles are included in an amount of 0.1 wt % to 10 wt % in the polishing slurry composition.

9. The polishing slurry composition of claim 7, wherein the pH of the polishing slurry composition is in the range of 2 to 11.

10. The polishing slurry composition of claim 7, further comprising a pH adjuster,
    wherein the pH adjuster comprises at least one selected from the group consisting of:
    at least one acidic material selected from the group consisting of hydrochloric acid, phosphoric acid, nitric acid, sulfuric acid, hydrofluoric acid, bromic acid, iodic acid, formic acid, malonic acid, maleic acid, oxalic acid, acetic acid, adipic acid, citric acid, propionic acid, fumaric acid, lactic acid, salicylic acid, pimelic acid, benzoic acid, succinic acid, phthalic acid, butyric acid, glutaric acid, glutamic acid, glycolic acid, aspartic acid, tartaric acid and salts thereof; and
    at least one basic material selected from the group consisting of ammonia, ammonium methyl propanol (AMP), tetra methyl ammonium hydroxide (TMAH), ammonium hydroxide, potassium hydroxide, sodium hydroxide, magnesium hydroxide, rubidium hydroxide, cesium hydroxide, sodium bicarbonate, sodium carbonate, and imidazole.

11. The polishing slurry composition of claim 7, wherein a target polishing layer of the polishing slurry composition is an oxide film, an insulating film, or both the oxide film and insulating film.

12. The polishing slurry composition of claim 7, wherein a polishing stop layer of the polishing slurry composition is a nitride film, a polysilicon film, or both the nitride film and polysilicon film.

* * * * *